United States Patent
Rahman

(10) Patent No.: US 9,059,696 B1
(45) Date of Patent: Jun. 16, 2015

(54) INTERPOSER WITH PROGRAMMABLE POWER GATING GRANULARITY

(71) Applicant: Altera Corporation, San Jose, CA (US)

(72) Inventor: Arifur Rahman, San Jose, CA (US)

(73) Assignee: Altera Corporation, San Jose, CA (US)

( * ) Notice: Subject to any disclaimer, the term of this patent is extended or adjusted under 35 U.S.C. 154(b) by 15 days.

(21) Appl. No.: 13/957,316

(22) Filed: Aug. 1, 2013

(51) Int. Cl.
*H03K 19/173* (2006.01)
*H03K 19/00* (2006.01)
*H03K 19/0175* (2006.01)
*H03K 17/14* (2006.01)

(52) U.S. Cl.
CPC .... *H03K 19/0013* (2013.01); *H03K 19/017581* (2013.01); *H03K 17/145* (2013.01)

(58) Field of Classification Search
None
See application file for complete search history.

(56) References Cited

U.S. PATENT DOCUMENTS

| 7,051,306 B2 | 5/2006 | Hoberman et al. | |
| 7,098,689 B1 * | 8/2006 | Tuan et al. | 326/44 |
| 7,490,302 B1 * | 2/2009 | Rahman et al. | 716/100 |
| 8,120,410 B2 | 2/2012 | Meijer et al. | |
| 8,273,610 B2 | 9/2012 | Or-Bach et al. | |
| 2010/0194470 A1 * | 8/2010 | Monchiero et al. | 327/566 |
| 2012/0211885 A1 | 8/2012 | Choi et al. | |
| 2014/0210097 A1 * | 7/2014 | Chen et al. | 257/774 |

OTHER PUBLICATIONS

Chen et al., U.S. Appl. No. 13/752,808, filed Jan. 29, 2013.

* cited by examiner

*Primary Examiner* — Jany Richardson
(74) *Attorney, Agent, or Firm* — Treyz Law Group; Jason Tsai

(57) ABSTRACT

A multichip package that includes an interposer and integrated circuits mounted on the interposer is provided. The interposer may include interposer routing circuitry and programmable power gating circuitry. At least one of the on-interposer integrated circuits may include power gating control logic that controls the programmable power gating circuitry. Circuitry on the integrated circuit may receive power supply voltage signals from the programmable power gating circuitry via the interposer routing circuitry. The programmable power gating circuitry may be configured to support fine, intermediate, and/or coarse power gating granularities. The programmable power gating circuitry may be used to selectively power down certain portions of the integrated circuit and may be used to provide desired power supply voltage levels to different voltage islands on the integrated circuit.

17 Claims, 9 Drawing Sheets

INTERPOSER WITH PROGRAMMABLE POWER GATING GRANULARITY

BACKGROUND

This invention relates to integrated circuits, and more particularly, to programmable integrated circuits.

Programmable integrated circuits are a type of integrated circuit that can be programmed by a user to implement a desired custom logic function. In a typical scenario, a logic designer uses computer-aided design (CAD) tools to design a custom logic circuit. These tools help the designer implement the custom logic circuit using the resources available on a given programmable integrated circuit. When the design process is complete, the CAD tools generate configuration data files. The configuration data is loaded into programmable devices to configure them to perform the desired custom logic function.

Power consumption is a critical challenge for modern integrated circuits such as programmable integrated circuits. Circuits with poor power efficiency place undesirable demands on system designers. Power supply capacity may need to be increased, thermal management issues may need to be addressed, and circuit designs may need to be altered to accommodate inefficient circuitry.

One way of improving power efficiency involves power gating different groups of circuits on an integrated circuit. For example, a programmable integrated circuit may include different groups of circuits organized according to their functionality and may include power gating circuitry for selectively powering the different groups of circuits. In particular, a first power gating transistor on the programmable integrated circuit may be used to supply power to a first group of circuits, whereas a second power gating transistor on the programmable integrated may be used to supply power to a second group of circuits. In this example, the first power gating transistor can be turned off to deactivate the first group of circuits while the second power gating transistor is turned on to activate the second group of circuits. Selectively activating/deactivating the different groups of circuits on the programmable integrated circuit can help improve power efficiency.

Each power gating transistors is typically formed adjacent to an associated group of circuits. As an example, the first power gating transistor that controls the first group of circuits is placed in a region on the integrated circuit in which the first group of circuits is formed. Accordingly, the area of a particular region may need to be sufficiently sized to accommodate the placement of the power gating transistors. Furthermore, each of the power gating transistors may need to be sufficiently large to mitigate potential IR drop (also known as voltage drop) problems. As such, additional area on the integrated circuit may need to be reserved for the power gating transistors and associated control circuitry that is used to selectively turn on and off the power gating transistors.

SUMMARY

A multichip package with programmable power gating granularity is provided. The multichip package may include an interposer and at least one integrated circuit mounted on top of the interposer. The interposer may include programmable power gating circuitry (e.g., power gating switches) and interposer routing circuitry. The on-interposer integrated circuit may include at least first and second circuits (e.g., multiplexing circuits and associated storage and processing circuit blocks) and power gating control logic for controlling the power gating circuitry.

The power gating control logic may output control signals that configure the power gating circuitry to operate at different power gating granularity settings. For example, the power gating control logic may configure the power gating circuitry to operate at a first power gating granularity setting (e.g., a coarse power gating granularity mode) for which the integrated circuit consumes a first amount of power and to operate at a second power gating granularity setting (e.g., a fine power gating granularity mode) for which the integrated circuit consumes a second amount of power that is less than the first amount of power.

The interposer routing circuitry may serve to route the control signals generated from the power gating control logic to the power gating circuitry. The integrated circuit may also include memory elements and logic gates associated with the power gating control logic. Each logic gate may have a first input that receives a respective one of the control signals from the power gating control logic, a second input that receives a static control bit from a respective one of the memory elements, and an output that is coupled to a corresponding power gating switch in the power gating circuitry.

In particular, the first and second circuits on the integrated circuit may be coupled to corresponding first and second power gating switches, respectively. When operating at coarse power gating granularity settings, the power gating control logic may jointly control the first and second power gating switches (e.g., by providing the first and second power gating switches with identical control signals). When operating at fine power gating granularity settings, the power gating control logic may independently adjust the first and second power gating switches (e.g., by providing the first and second power gating switches with different control signals). If desired, the first and second power gating switches may be coupled to each other during coarse power gating modes.

Further features of the present invention, its nature and various advantages will be more apparent from the accompanying drawings and the following detailed description.

DETAILED DESCRIPTION

Embodiments of the present invention relate to integrated circuits, and more particularly, to multichip packages that include a plurality of integrated circuits. It will be recognized by one skilled in the art, that the present exemplary embodiments may be practiced without some or all of these specific details. In other instances, well-known operations have not been described in detail in order not to unnecessarily obscure the present embodiments.

Figure 1:
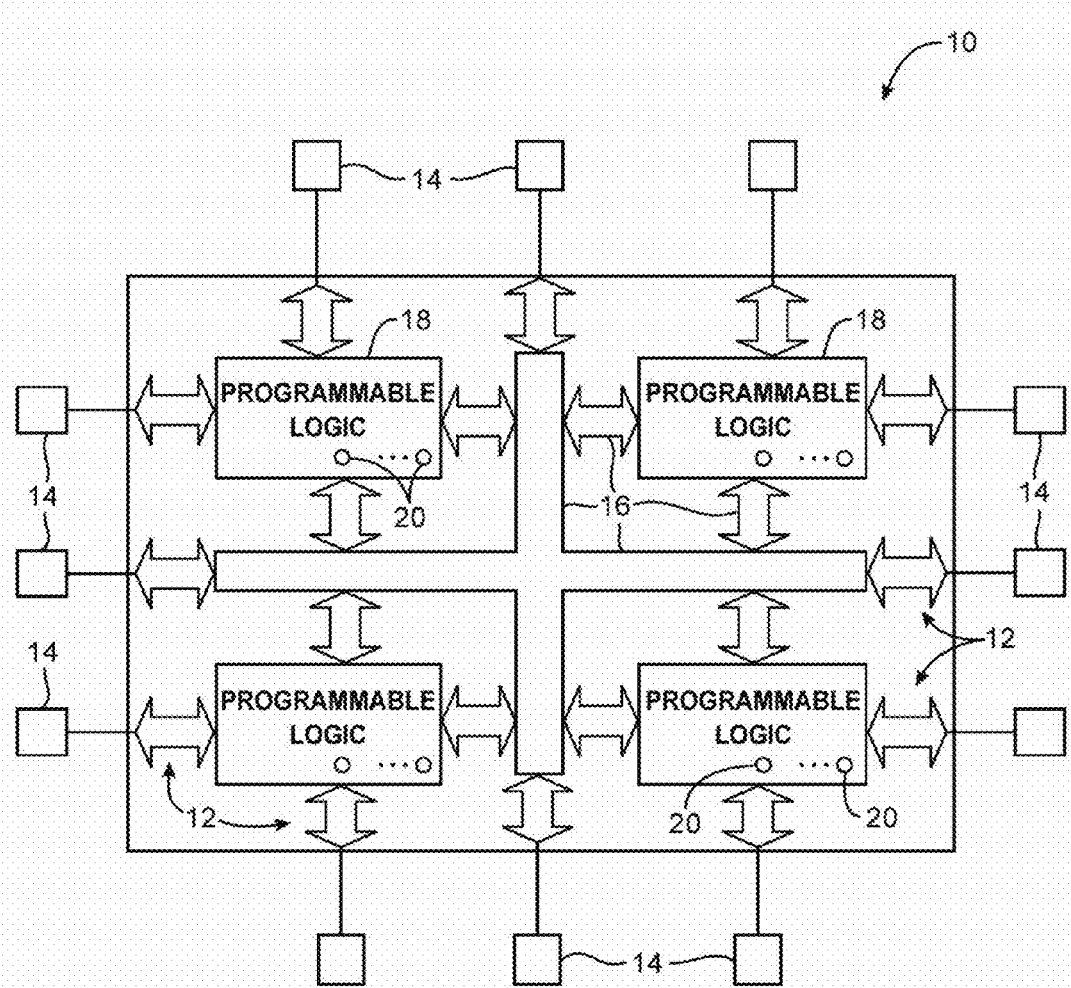
FIG. 1 is a diagram of an illustrative programmable integrated circuit in accordance with an embodiment of the present invention.

An illustrative integrated circuit of the type that may be provided with memory elements and associated circuits that can be controlled using output signals from the memory elements is shown in FIG. 1. As shown in FIG. 1, integrated circuit 10 may contain memory elements 20. Memory elements 20 may be loaded with configuration data to configure programmable transistors such as pass transistors (sometimes referred to as pass gates or pass gate transistors) in programmable circuitry such as programmable logic 18.

Because memory elements 20 may be used in storing configuration data for programmable logic 18, memory elements 20 may sometimes be referred to as configuration random-access memory (CRAM) cells. Integrated circuit 10 may be configured to implement custom logic functions by configuring programmable logic 18. As a result, integrated circuit 10 may sometimes be referred to as a programmable integrated circuit or a programmable logic device (PLD) integrated circuit.

As shown in FIG. 1, programmable integrated circuit 10 may have input-output (I/O) circuitry 12 for driving signals off of device 10 and for receiving signals from other devices via input-output pins 14. Interconnection resources 16 such as global and local vertical and horizontal conductive lines and buses may be used to route signals on device 10. Interconnection resources 16 may include fixed interconnects (conductive lines) and programmable interconnects (i.e., programmable connections between respective fixed interconnects).

Programmable logic 18 may include combinational and sequential logic circuitry. Programmable logic 18 may be configured to perform a custom logic function. The programmable interconnects associated with interconnection resources 16 may be considered to form a part of programmable logic 18.

When memory elements 20 are loaded with configuration data, the memory elements each provide a corresponding static control output signal that controls the state of an associated logic component in programmable logic 18. The memory element output signals may, for example, be used to control the gates of metal-oxide-semiconductor (MOS) transistors such as n-channel metal-oxide-semiconductor (NMOS) pass transistors in programmable components such as multiplexers, logic gates such as AND gates, OR gates, XOR gates, NAND gates, NOR gates, etc. P-channel transistors (e.g., a p-channel metal-oxide-semiconductor pass transistor) may also be controlled by output signals from memory elements 20, if desired.

When a memory element output that is associated with an NMOS pass transistor is high, the pass transistor controlled by that memory element is turned on and passes logic signals from its input to its output. When the memory element output is low, an NMOS pass transistor is turned off and does not pass logic signals. P-channel metal-oxide-semiconductor (PMOS) pass transistors are turned on when the signal that is applied to its gate from the output of a memory element is low (e.g., 0 volts) and are turned off when the output of the memory element is high (i.e., the polarity for NMOS and PMOS control signals is reversed).

Configuration random-access memory elements 20 may be arranged in an array pattern. There may be, for example, millions of memory elements 20 on integrated circuit 10. During programming operations, the array of memory elements is provided with configuration data. Once loaded with configuration data, memory elements 20 may selectively control (e.g., turn on and off) portions of the circuitry in the programmable logic 18 and thereby customize the circuit functions of circuit 10.

The circuitry of programmable integrated circuit 10 may be organized using any suitable architecture. As an example, the circuitry of programmable integrated circuit 10 may be organized in a series of rows and columns of programmable logic blocks (regions) each of which contains multiple smaller logic regions. The logic resources of integrated circuit 10 may be interconnected by interconnection resources 16 such as associated vertical and horizontal conductors. These conductors may include global conductive lines that span substantially all of device 10, fractional lines such as half-lines or quarter lines that span part of device 10, staggered lines of a particular length (e.g., sufficient to interconnect several logic areas), smaller local lines, or any other suitable interconnection resource arrangement. If desired, the circuitry of programmable integrated circuit 10 may be arranged in more levels or layers in which multiple large regions are interconnected to form still larger portions of logic. Still other device arrangements may use logic that is not arranged in rows and columns.

As integrated circuit fabrication technology scales towards smaller process nodes, it becomes increasingly challenging to design an entire system on a single integrated circuit die (sometimes referred to as a system-on-chip). Designing analog and digital circuitry to support desired performance levels while minimizing leakage and power consumption can be extremely time consuming and costly.

One alternative to single-die packages is an arrangement in which multiple dies are placed within a single package. Such types of packages that contain multiple interconnected dies may sometimes be referred to as systems-in-package (SiPs), multichip modules (MCM), or multichip packages. Placing multiple chips (dies) into a single package may allow each die to be implemented using the most appropriate technology process (e.g., a memory chip may be implemented using the 28 nm technology node, whereas the radio-frequency analog chip may be implemented using the 90 nm technology node), may increase the performance of die-to-die interface (e.g., driving signals from one die to another within a single package is substantially easier than driving signals from one package to another, thereby reducing power consumption of associated input-output buffers), may free up input-output pins (e.g., input-output pins associated with die-to-die connections are much smaller than pins associated with package-to-board connections), and may help simplify printed circuit board (PCB) design (i.e., the design of the PCB on which the multichip package is mounted during normal system operation).

Figure 2:
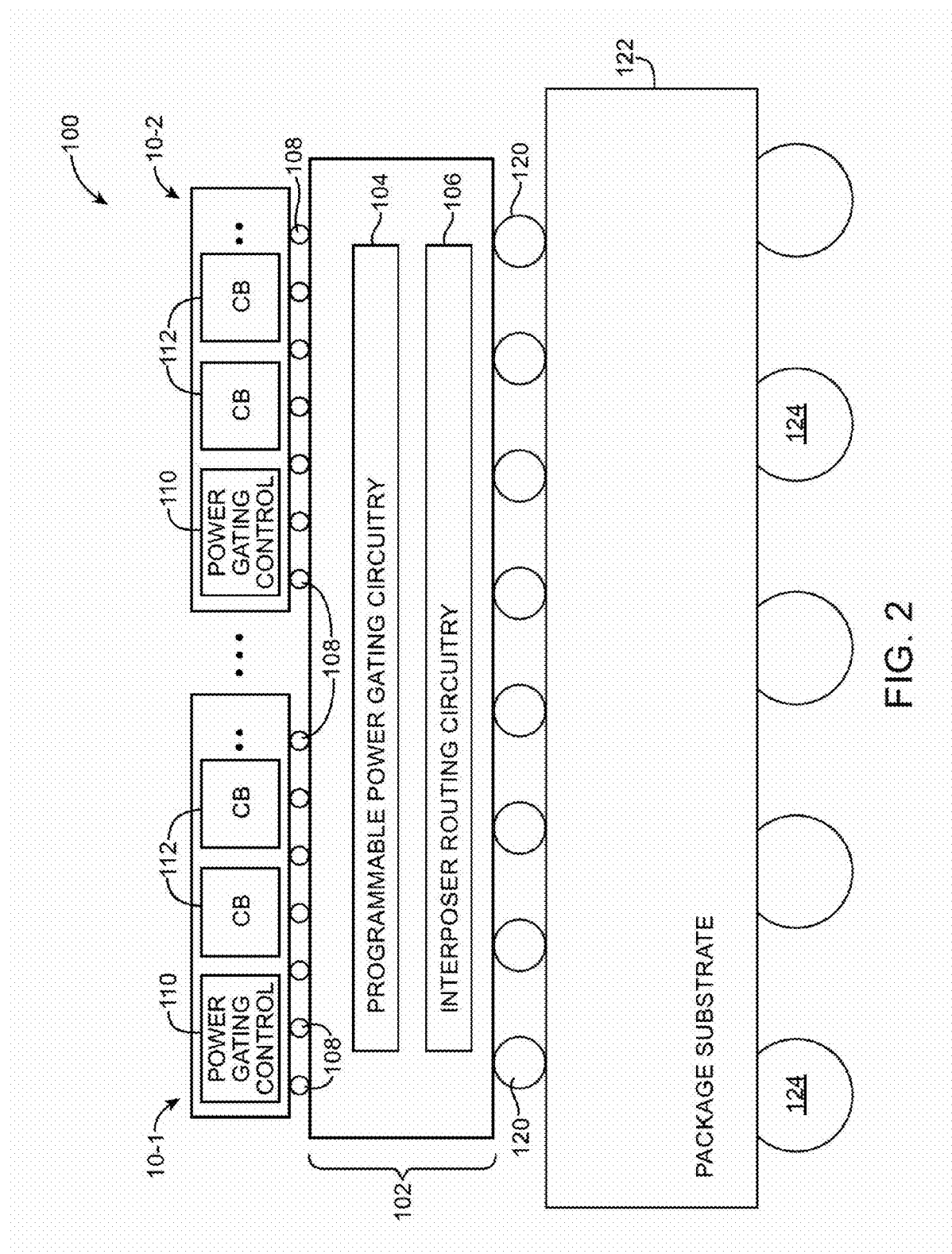
FIG. 2 is a cross-sectional side view of an illustrative multichip package having at least two dies that are arranged laterally on top of an interposer in accordance with an embodiment of the present invention.

FIG. 2 is a cross-sectional side view of an illustrative integrated circuit package such as multichip package 100. As shown in FIG. 2, multichip package 100 may include a package substrate such as package substrate 122, interposer 102 that is mounted on top of package substrate 122, and multiple dies mounted on top of interposer 102 (e.g., dies 10-1 and 10-2 may be mounted laterally with respect to each other on top of interposer 102).

Package substrate 122 may be coupled to a board substrate (e.g., a printed circuit board on which multichip package 100 is mounted) via solder balls 124. As an example, solder balls 124 may form a ball grid array (BGA) configuration for interfacing with corresponding conductive pads on the printed circuit board (PCB). The exemplary configuration of FIG. 2 in which two laterally positioned dies are interconnected via an interposer structure 108 may sometimes be referred to as 2.5-dimensional ("2.5D") stacking. If desired, more than two laterally (horizontally) positioned dies may be mounted on top of interposer structure 108. In other suitable arrangements, multiple dies may be stacked vertically on top of one another. In general, multichip package may include any number of dies stacked on top of one another and dies arranged laterally with respect to one another.

Dies 10-1 and 10-2 may be coupled to interposer 102 via microbumps 108. Microbumps 108 may refer to solder bumps that are formed on the top layer of dies 10 and may each have a diameter of 10 μm (as an example). In particular, microbumps 108 may be deposited on microbump pads that are formed in the uppermost layer of a dielectric interconnect stack in each of dies 10.

Interposer 102 may be coupled to package substrate 122 via bumps 120. Bumps 120 that interface directly with package substrate 122 may sometimes be referred to as controlled collapse chip connection (C4) bumps or "flip-chip" bumps and may each have a diameter of 100 μm (as an example). Generally, flip-chip bumps 120 (e.g., bumps used for interfacing with off-package components) are substantially larger in size compared to microbumps 108 (e.g., bumps used for interfacing with other dies within the same package). The number of microbumps 108 is typically much greater than the number of flip-chip bumps 120 (e.g., the ratio of the number of microbumps to the number of flip-chip bumps may be greater than 2:1, 5:1, 10:1, etc.).

In one suitable arrangement, interposer 102 may be formed from silicon. Interposer 102 of this type may include circuitry such as interposer routing circuitry 106 that can be used for providing desired routing connections for dies 10 within multichip package 100. The dies that are mounted on interposer 102 without multichip package 100 are sometimes referred to as "on-interposer" devices. In general, any type of bare-die integrated circuit 10 may be mounted on top of interposer 102, including but not limited to devices such as microprocessors (or CPUs), digital signal processors (DSPs), application specific standard products (ASSPs), application specific integrated circuits (ASICs), static random-access memory (SRAM) chips, dynamic random-access memory (DRAM) chips, read-only memory (ROM) chips, programmable array logic (PAL), programmable logic arrays (PLAs), field programmable logic arrays (FPGAs), electrically programmable logic devices (EPLDs), electrically erasable programmable logic devices (EEPLDs), logic cell arrays (LCAs), field programmable gate arrays (FPGAs), just to name a few.

Interposer routing circuitry 106 may be used to form routing connections for each of the on-interposer devices via microbumps 108 and to form routing connections to other devices on package substrate 122 via flip-chip bumps 120. Routing circuitry 106 may include fixed and/or configurable interconnection resources such as global and local vertical and horizontal conductive lines and buses for routing signals through interposer 102. The global conductive lines may span substantially all of interposer 102, whereas the local conductive lines may span only part of interposer 102. If desired, interposer 102 may also contain some logic for implementing interface functionality for facilitating communications between different dies in package 100 and for performing other desired functions for the on-interposer devices. Offloading some of these functions from the on-interposer devices to interposer-embedded logic can help reduce processing requirements for the on-interposer devices.

As shown in FIG. 2, interposer 102 may also include power gating circuitry such as programmable power gating circuitry 104. Programmable power gating circuitry 104 may be used to selectively provide power supply voltage signals to desired portions of each on-interposer device. For example, power gating circuitry 104 may receive power supply voltage signals that is provided from an external power source via solder balls 124 and flip-chip bumps 120 and may route the received power supply voltage signals to selected portions of each on-interposer device 10 (e.g., dies 10-1 and 10-2).

Device 10 (e.g., a programmable logic device) may be organized into multiple regions sometimes referred to herein as circuit blocks (CB) 112. Each circuit block 112 in device 10 may be configured to serve as a memory block (e.g., a region of random-access memory elements), a digital signal processing (DSP) block, a custom logic array block (LAB), a communications network block, an application-specific processing block, a block exhibiting a combination of these features, or other blocks capable of providing the desired functionality. Some of the circuit blocks 112 that are in use may be powered while other circuit block 112 that are idle may be deactivated (e.g., a selected group of circuit blocks 112 may receive power from programmable power gating circuitry 104 while other groups of circuits blocks 112 are prevented from receiving power from circuitry 104).

Device 10 may also include control circuitry such as power gating control logic 110 for determining which portion(s) of device 10 should be powered (i.e., which portions of device 10 should receive power supply voltage signals) and which portion(s) of device 10 should be power-gated (i.e., which portions of device 10 should not receive power supply voltage signals). Power gating circuitry 104 may be configured to provide programmable power gating granularity to provide flexibility in ways for power gating the unused portion of each device 10.

As an example, each circuit block 112 in device 10 may be routed to a corresponding power gating transistor in programmable power gating circuitry 104 via interposer routing circuitry 106. In this example, a first circuit block 112 may be coupled to a first power gating transistor; a second circuit block 112 may be coupled to a second power gating transistor; and a third circuit block 112 may be coupled to a third power gating transistor. If it is determined that the second circuit block 112 need not be used, power gating control logic 110 may output appropriate control signals to turn off the second power gating transistor (i.e., to place the second circuit block 112 in "sleep" mode) while turning on the first and third power gating transistors (i.e., to place the first and third circuit blocks 112 in "active" mode). This arrangement in which each circuit block 112 is being controlled by one common power gating switch may be referred to as exhibiting "coarse" or "block-level" power gating granularity.

As another example, each circuit block 112 may include multiple sub-blocks and associated routing circuits including but not limited to multiplexing circuits. In this example, each sub-block and multiplexing circuit in a circuit block 112 may be routed to a corresponding power gating transistor in programmable power gating circuitry 104 via interposer routing circuitry 106. If it is desired that a particular sub-block be switched out of use, power gating control logic 110 may be used to turn off the corresponding power gating transistor coupled to that particular sub-block. Similarly, if it is desired that a particular multiplexer be switched out of use, power gating control logic 110 may turn off the corresponding power gating transistor coupled to that particular multiplexer. This arrangement in which each sub-block and each multiplexer within a circuit block 112 is being independently controlled by a different respective power gating switch may be referred to as exhibiting "fine" power gating granularity (relative to the coarse power gating granularity configuration).

As yet another example, each circuit block 112 may be organized into multiple groups of sub-blocks and multiple groups of routing circuits (e.g., multiplexers and associated drivers). Each group of sub-blocks and each group of routing circuits may be routed to a corresponding power gating transistor in programmable power gating circuitry 104 via interposer routing circuitry 106. Power gating control logic 110 may be used to selectively power down a particular group (or groups) of sub-blocks and/or a particular group (or groups) of routing circuits by deactivating the corresponding power gating transistor coupled to that particular group of sub-blocks or routing circuits. This arrangement in which each group of sub-blocks or multiplexers within a circuit block 112 is being power-gated by a different respective power gating switch may be referred to as exhibiting "intermediate" power gating granularity.

In general, interposer 102 may be configured to provide mixed power gating granularities. Device 10 may include some circuit blocks 112 operated in the fine power gating granularity mode and other blocks 112 operated in the coarse power gating granularity mode. For example, a first circuit block 112 serving as a custom logic array block can have fine granularity, whereas a second circuit block 112 serving as a digital signal processor may have coarse granularity. The categorization of the power gating granularities into fine, intermediate, and coarse is merely illustrative. In general, the resolution of power gating can range continuously from power gating any individual transistor on device 10 to power gating a substantial portion of device 10. In other suitable embodiments, a circuit block 112 may exhibit hybrid power gating granularities (e.g., some parts of the circuit block are operated in the fine power gating granularity mode while other parts of the circuit block are operated in intermediate or coarse power gating granularity modes).

The example of FIG. 2 in which integrated circuit package 100 includes multiple dies mounted on interposer 102 is merely illustrative and does not serve to limit the scope of the present invention. If desired, integrated circuit package 100 may include a single die that is mounted on interposer having programmable power gating circuitry 104. Offloading programmable power gating circuitry in a single-chip package arrangement as such may be desirable to help free up resources in the on-interposer die, reduce cost of manufacturing, design time, etc. As an example, the die may be formed using a first state-of-the-art technology node (e.g., 28 nm CMOS technology node), whereas the interposer may be formed using a second older technology node (e.g., 45 nm CMOS technology node) that is cheaper and does not have to be redesigned every time the system shifts to a newer technology node.

Figure 3:
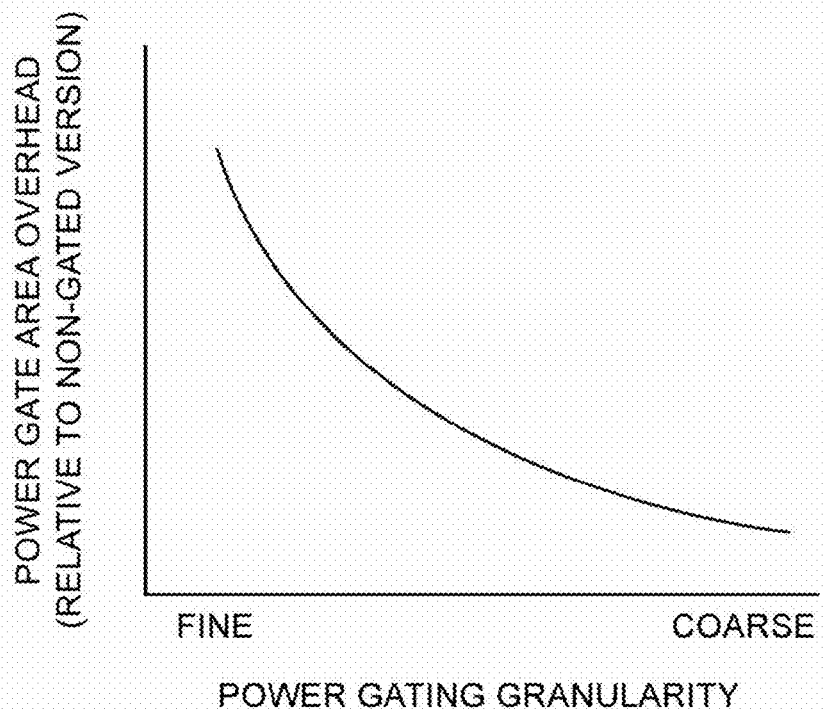
FIG. 3 is a diagram that plots area overhead associated with power gating circuitry versus power gating granularity in accordance with an embodiment of the present invention.

Programmable power gating granularity enables a user to select a desired tradeoff between cost and power consumption. FIG. 3 is a graph plotting area overhead (relative to non-power-gated embodiments) versus the different power gating granularity settings. As shown in FIG. 3, finer power gating granularity arrangements require more area overhead, whereas coarser power gating granularity arrangements required less area overhead. This is because finer power gating arrangements require more routing resources to individually connect different circuits to corresponding power gating switches and more complex power management logic for controlling the increased number of power gating switches (relative to coarse power gating granularity configurations). In general, finer power gating granularity results in increased area overhead.

Figure 4:
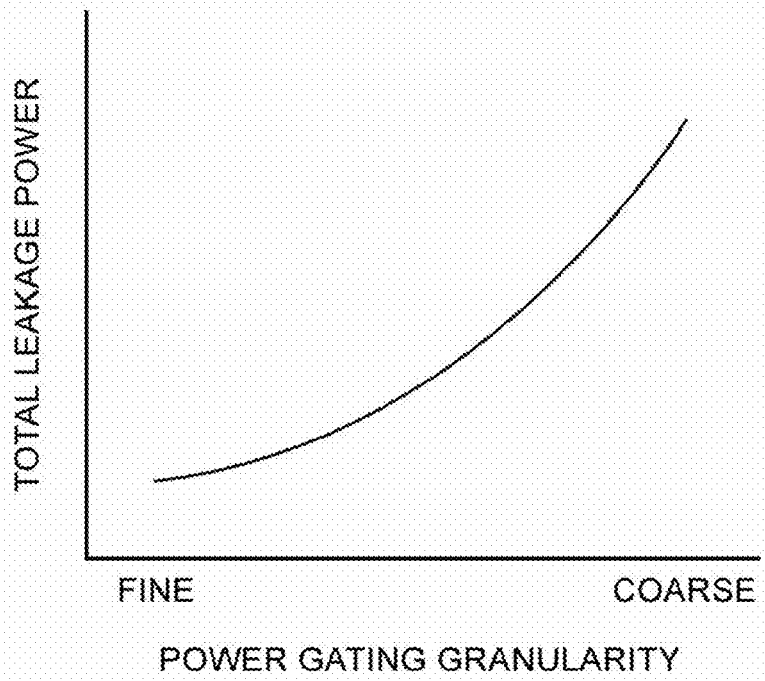
FIG. 4 is a diagram that plots total leakage power versus power gating granularity in accordance with an embodiment of the present invention.

FIG. 4 is a graph plotting total leakage power consumption versus the different power gating granularity settings. As shown in FIG. 4, finer power gating granularity enables the user to place a higher percentage of unused circuitry in sleep mode, thereby reducing power consumption. When operating with coarse power gating granularity settings, however, a relatively smaller percentage of the idle circuitry can be placed in sleep mode. Consider a scenario in which only 5% of the logic elements in a particular circuit block 112 is in use. Even though 95% of the remaining circuitry in that circuit block 112 is idle, the entire circuit block 112 will have to be activated if coarse power gating granularity were used. As a result, coarser power gating granularity generally results in increased power consumption.

In coarse-grain power gating arrangements, it is probable that only a small portion of circuitry associated with a particular power gating transistor is likely to switch simultaneously. As granularity becomes smaller (i.e., more fine), a larger percentage of the circuitry per power gate is likely switch simultaneously. Since the size of a power gating transistor depends on how much current it has to source to support worst case switching, coarse-grain granularity generally requires relatively smaller sized power gates relative to fine-grain granularity.

The use of device 10 (sometimes referred to as a "power-gating-enabled" device) that includes power gating control logic 110 and that is capable of interfacing with interposer 102 having embedded power gating circuitry capable of providing programmable power gating granularity may allow a user to make design tradeoffs between power reduction and area. Depending on the requirements of a certain application, the user may either elect to operate device 10 using fine power gating granularity settings, coarse power gating granularity settings, or some intermediate power gating granularity settings.

As an example, an application that requires minimal power consumption and that has no area constraint may be implemented using fine power gating granularity. As another example, an application that requires minimal area but has no power constraints may be implemented using coarse power gating granularity. As yet another example, an application that has both area and power constraints may be implemented using intermediate power gating granularity or using a mix of fine, coarse, and/or intermediate power gating granularities.

In general, interposer 102 and each power-gating-enabled-device 10 that is capable of interacting with the programmable power gating circuitry 104 on interposer 102 are designed to support the finest power gating granularity. For example, interposer 102 may be programmed via metal option, fuse option, or reconfigurable option to enable the different power gating granularities. The metal option involves using predefined masking layers during the fabrication of interposer 102 to form only the metal routing connections necessary for the desired granularity. The fuse option involves selectively blowing fuses during production to break certain routing connections on interposer 102 to obtain the desired granularity. The reconfigurable option involves the use of static control signals or the use of dynamically adjustable control signals to selectively short or open certain routing connections on interposer 102 to obtain the desired granularity. Providing programmability in this way, the choice of power gating granularity becomes a late binding architectural decision that does not affect the base design or layout of the on-interposer devices 10 and interposer 102. In other words, the same base design for device 10 may be reused to provide a family of differentiated products offering different static power, performance, and area/cost tradeoffs.

Figure 5:
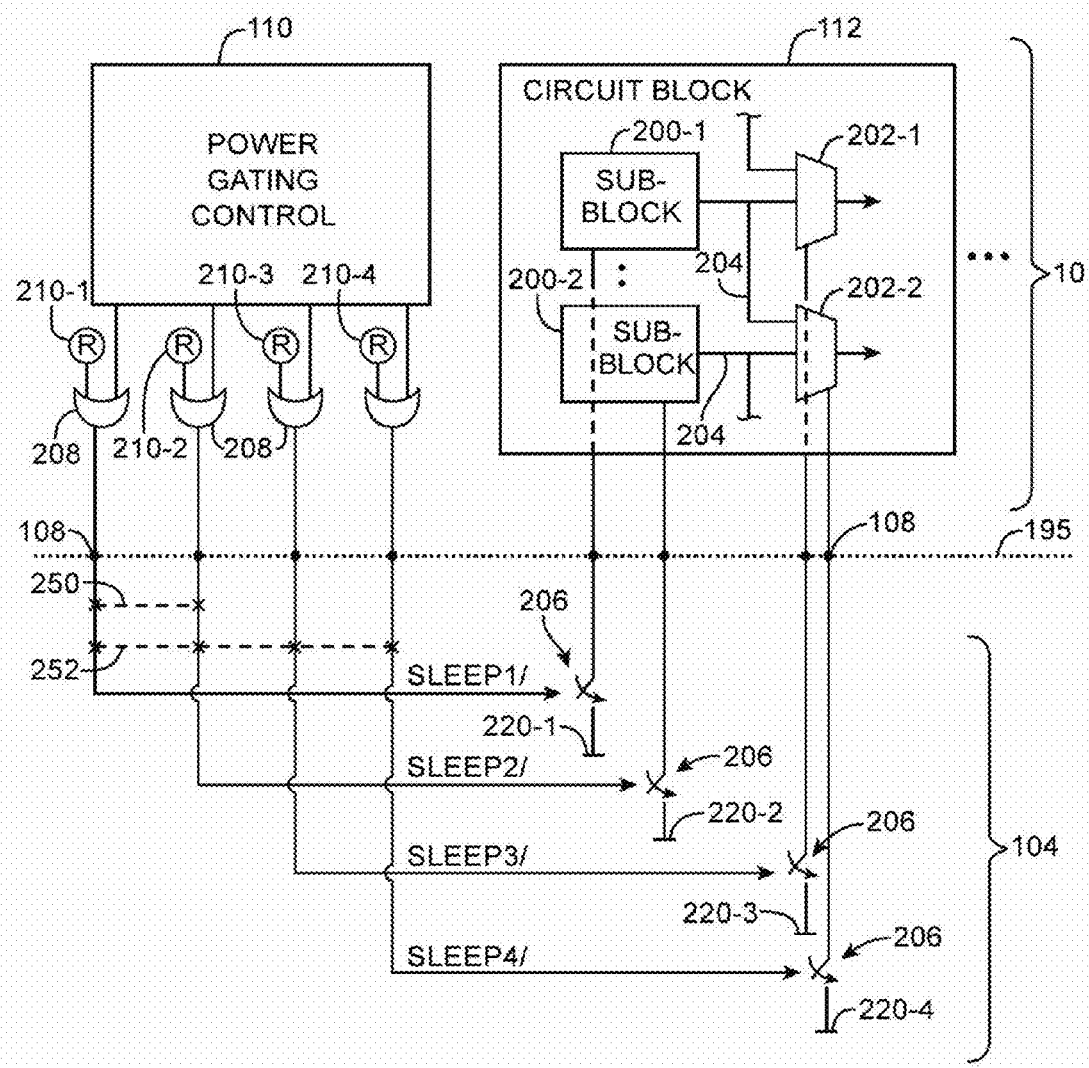
FIG. 5 is a diagram of power gating circuitry for supporting "fine" power gating granularity in accordance with an embodiment of the present invention.

FIG. 5 shows is a diagram illustrating a fine power gating granularity arrangement. As shown in FIG. 5, a circuit block 112 on device 10 may include multiple sub-blocks such as sub-block 200-1 and sub-block 200-2 and associated routing circuits such as multiplexers 202-1 and 202-2. Sub-blocks 200 (e.g., sub-blocks 200-1 and 200-2) may be coupled to associated routing circuits 202 (e.g., multiplexers 202-1 and 202-2) via routing connections 204. The routing circuits 202 may serve as routing resources that interconnect the different sub-blocks 200 in block 112. In general, each circuit block 112 may include more than two sub-blocks 200, more than two multiplexing circuits 202, and other control circuitry.

In the example of FIG. 5, each sub-block 200 and each multiplexer 202 in circuit block 112 may be coupled to a corresponding power gating switch 206 via microbump 108. Dotted line 195 merely represents the interface between device 10 and interposer 102 and does not represent a routing path. Circuit block 112 and power gating control logic 110 in device 10 may be coupled to power gating circuitry 104 via interposer routing circuitry 106. In particular, first sub-block 200-1 may be coupled to a first power supply line 220-1 via a first power gating switch 206; second sub-block 200-2 may be coupled to a second power supply line 220-2 via a second power gating switch 206; first multiplexer 202-1 may be coupled to a third power supply line 220-3 via a third power gating switch 206; and second multiplexer 202-2 may be coupled to a fourth power supply line 220-4 via a fourth power gating switch 206. Power gating switches 206 in programmable power gating circuitry 104 in interposer 102 may be n-channel transistors, p-channel transistors, or other types of adjustable circuits. The voltages on power supply lines 220 (e.g., power supply lines 220-1, 220-2, 220-3, and 220-4) may be the same or may be different and may be a positive power supply voltage signal, a ground power supply voltage signal, some intermediate power supply voltage signal, or a negative power supply voltage signal.

Power gating switches 206 may receive control signals from power gating control logic 110 in device 10. Power gating control logic 110 is sometimes referred to as an on-chip power management unit (PMU). In this example, first switch 206 receives a first sleep control signal SLEEP1/ from logic 110; second switch 206 receives a second sleep control signal SLEEP2/ from logic 110; third switch 206 receives a third sleep control signal SLEEP3/ from logic 110; and fourth switch 206 receives a fourth sleep control signal SLEEP4/ from logic 110.

Power gating control logic 110 may have associated logic gates such as logic OR gates 208 that are used to produce these sleep control signals. A first logic OR gate 208 on device 10 may have a first input that receives a first static control bit from storage element 210-1, a second input that receives a first dynamic control signal from logic 110, and an output on which SLEEP1/ is provided. A second logic OR gate 208 on device 10 may have a first input that receives a second static control bit from storage element 210-2, a second input that receives a second dynamic control signal from logic 110, and an output on which SLEEP2/ is provided. A third logic OR gate 208 on device 10 may have a first input that receives a third static control bit from storage element 210-3, a second input that receives a third dynamic control signal from logic 110, and an output on which SLEEP3/ is provided. A fourth logic OR gate 208 on device 10 may have a first input that receives a fourth static control bit from storage element 210-4, a second input that receives a fourth dynamic control signal from logic 110, and an output on which SLEEP4/ is provided.

Storage element 210 (e.g., element 210-1, 210-2, 210-3, or 210-4) may be a volatile memory element (e.g., a CRAM cell loaded with configuration data, etc.) or a nonvolatile memory element (e.g., fuses, antifuses, electrically-programmable read-only memory elements, etc.). Storage element 210 may be configured to store a logic "1" to statically deassert the corresponding sleep control signal (assuming the power gating switch 206 under control is a p-channel pull-up transistor). On the other hand, storage element 210 may be configured to store a logic "0," thereby allowing the dynamic control signal generated directly from control logic 110 to pass through as the sleep control signal.

For example, consider a scenario in which storage element 210-1 stores a high voltage signal while storage element 210-2 stores a low voltage signal. In this example, signal SLEEP1/ will be deasserted, thereby turning off the first switch 206. As a result, sub-block 200-1 will be powered down. However, the state of the second switch 206 may depend on whether the dynamic control signal arriving from logic 110 at the second input of the second logic OR gate 208 is current high or low. When the dynamic control signal is high, SLEEP2/ will be deasserted to turn off the second switch, thereby deactivating second sub-block 200-2. When the dynamic control is low, SLEEP2/ will be asserted to turn on the second switch, thereby activating second sub-block 200-2. In other words, SLEEP2/ can be adjusted in real-time to selectively activate/deactivate sub-block 200-2. Configured in this way, each sub-block 200 and multiplexer 202 in circuit block 112 can be selectively powered down by providing storage elements 210 with an appropriate pattern of static control bits or by using power gating control logic 110 to generate appropriate dynamic control signals to power gating switches 206 in power gating circuitry 104.

The use of logic OR gates 208 in generating the sleep control signals is merely illustrative. If desired, other logic gates such as AND gates, NAND gates, NOR gates, XOR gates, and/or XNOR gates can be used to generate the different sleep control signals. The arrangement of FIG. 5 in which each sub-block 200 and multiplexer 202 is controlled using a dedicated power gating switch illustrates a fine power gating granularity configuration. As described above, dotted paths 250 and 252 show potential connections that can be made via metal/fuse/reconfigurable option to short at least some of the sleep control signal paths, thereby reducing the power gating granularity.

For example, the gate of the first power gating switch 206 may be coupled the gate of the second power gating switch 206 during coarse power gating granularity modes of operation. In this example, the first and second power gating switches may be jointed adjusted and may receive identical sleep control signals. As another example, the gate of the first power gating switch 206 may be decoupled from the gate of the second power gating switch 206 during fine power gating granularity modes of operation. In this example, the first and second power gating switches may be independently adjusted and may receive different sleep control signals. In other suitable embodiments, power gating control logic 110 and associated gates 208 need not be formed on integrated circuit 10 and may instead be formed as part of interposer 102.

Figure 6:
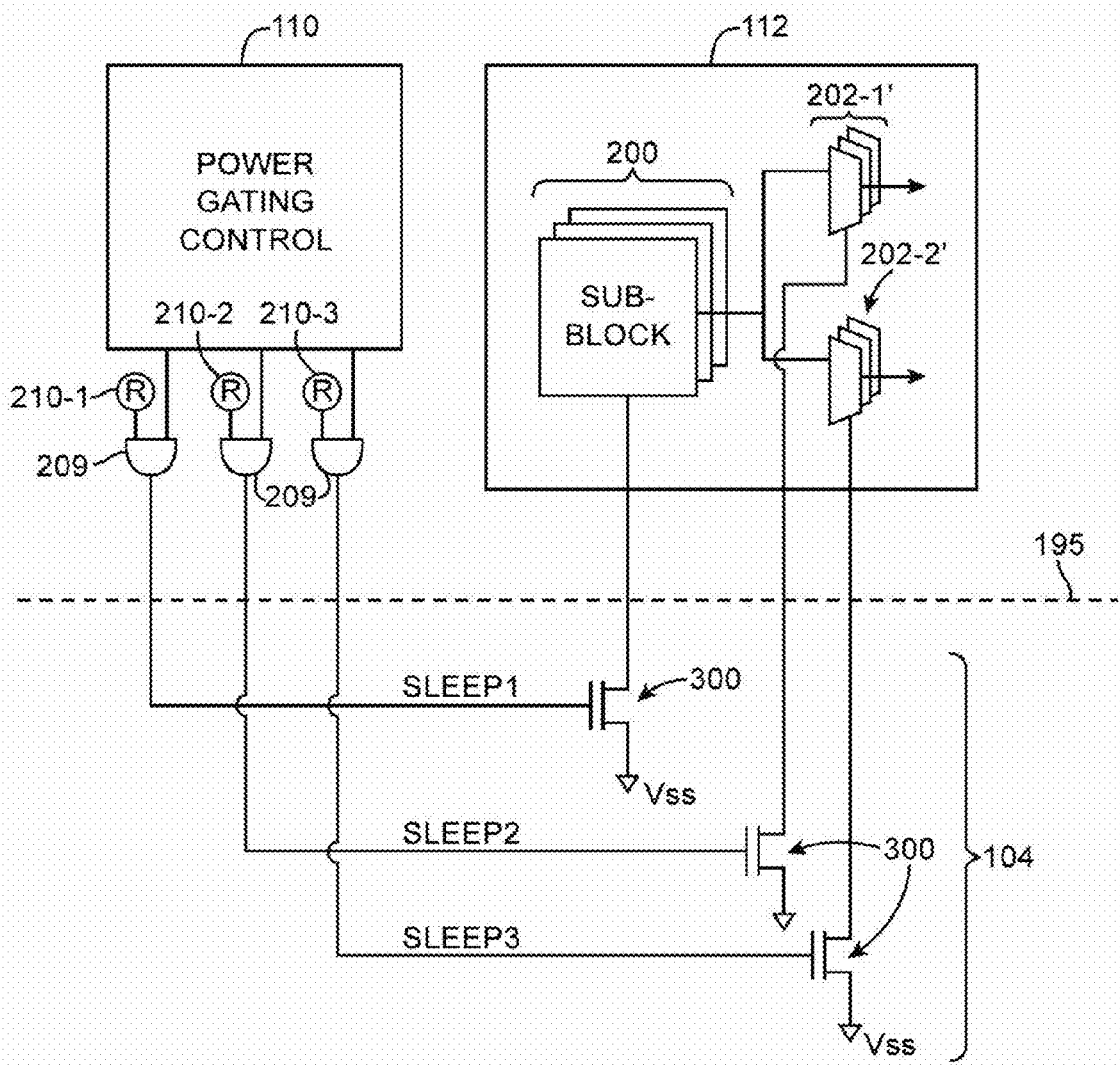
FIG. 6 is a diagram of power gating circuitry for supporting "intermediate" power gating granularity in accordance with an embodiment of the present invention.

FIG. 6 is a diagram showing another suitable arrangement in which programmable power gating circuit 104 on interposer 102 is configured to implement intermediate power gating granularity. As shown in FIG. 6, circuit block 112 may be organized into groups of sub-blocks and groups of routing circuits, where each group of sub-blocks includes two or more sub-blocks 200 and where each group of routing multiplexers includes two or more routing multiplexers 202. In the example of FIG. 6, a group of sub-blocks 200 may be coupled to a corresponding first power gating transistor 300, a first group of routing multiplexers 202-1' may be coupled to a corresponding second power gating transistor 300, and a second group of routing multiplexers 202-2' may be coupled to a corresponding third power gating transistor 300. Power gating transistors may be n-channel transistors that supply ground power supply signal Vss to circuit block 112 (as an example).

The first power gating transistor may receive a first sleep control signal SLEEP1 from a first AND logic gate 209 on device 10; the second power gating transistor may receive a second sleep control signal SLEEP2 from a second logic AND gate 209 on device 10; and the third power gating transistor may receive a third sleep control signal SLEEP3 from a third logic AND gate 209 on device 10. Logic gates 209 of FIG. 6 may be used to generate power gating control signals in a way similar to logic gates 208 described in connection with FIG. 5. Any one of the three logic AND gates 209 may output a deasserted sleep control signal when the associated memory element 210 provides a logic "0" to the first input of that logic AND gate. When memory element 210 stores a logic "1," the corresponding sleep control signal may be dynamically adjusted using power gating control logic 110 (e.g., by providing an adjustable control signal to the second input of that logic AND gate with power management unit 110).

When switching from the fine power gating granularity of FIG. 5 to the intermediate power gating granularity of FIG. 6, the routing of power lines on programmable integrated circuit 10 need not be changed. If desired, some of the power lines on device 10 can be rerouted or shorted when implementing reduced power gating granularity. In one suitable arrangement, a particular power gating granularity configuration is implemented by rerouting the power lines that is coupled to the circuit blocks on device 10 via microbumps 108 by configuring interposer routing circuitry 106 so that the power lines are properly connected to a desired number of power gating transistors in programmable power gating circuitry 104.

For example, to implement fine power gating granularity, each individual power line associated with a particular sub-block 200 or multiplexer 202 may be routed to a corresponding dedicated power gating transistor that serves to power gate that particular sub-block or multiplexer. When implementing intermediate power gating granularity, the power lines associated with a particular group of sub-blocks 200 or multiplexers 202 may be shorted and routed to one corresponding dedicated power gating transistor that serves to power gate that particular group of circuitry. In either scenario, power gating control logic 110 will have to be able to generate appropriate sleep control signals for controlling the relevant power gating transistors in programmable power gating circuitry 104.

In another suitable arrangement, a particular power gating granularity configuration is implemented via intelligent control of the sleep control signals. Referring to the example of FIG. 5, signals SLEEP1/ and SLEEP2/ can be independently adjusted when implementing fine power gating granularity and can be jointly adjusted when implementing relatively coarser power gating granularities (e.g., different power gating switches 206 may receive different control signals when circuitry 104 is configured in the fine power gating mode, whereas different power gating switches 206 may receive identical control signals when circuitry 104 is configured in the coarse power gating mode). Similarly, signals SLEEP3 and SLEEP4 can be independently adjusted when implementing fine power gating granularity and can be adjusted together (in tandem) when implemented intermediate power gating granularities. In certain embodiments, all of signals SLEEP1, SLEEP2, SLEEP3, SLEEP4, and other power gating control signals associated with circuit block 112 may be collectively adjusted when implementing coarse power gating granularities.

In such arrangements, rerouting the power lines need not be necessary as long as power gating control logic 110 can handle generation of all suitable sleep control signals for each particular power gating granularity configuration. In general, a combination of rerouting power lines using interposer routing circuitry 106 and appropriate handling of power gating control signals with power gating control logic 110 can be used in implementing the desired power gating granularity.

Figure 7:
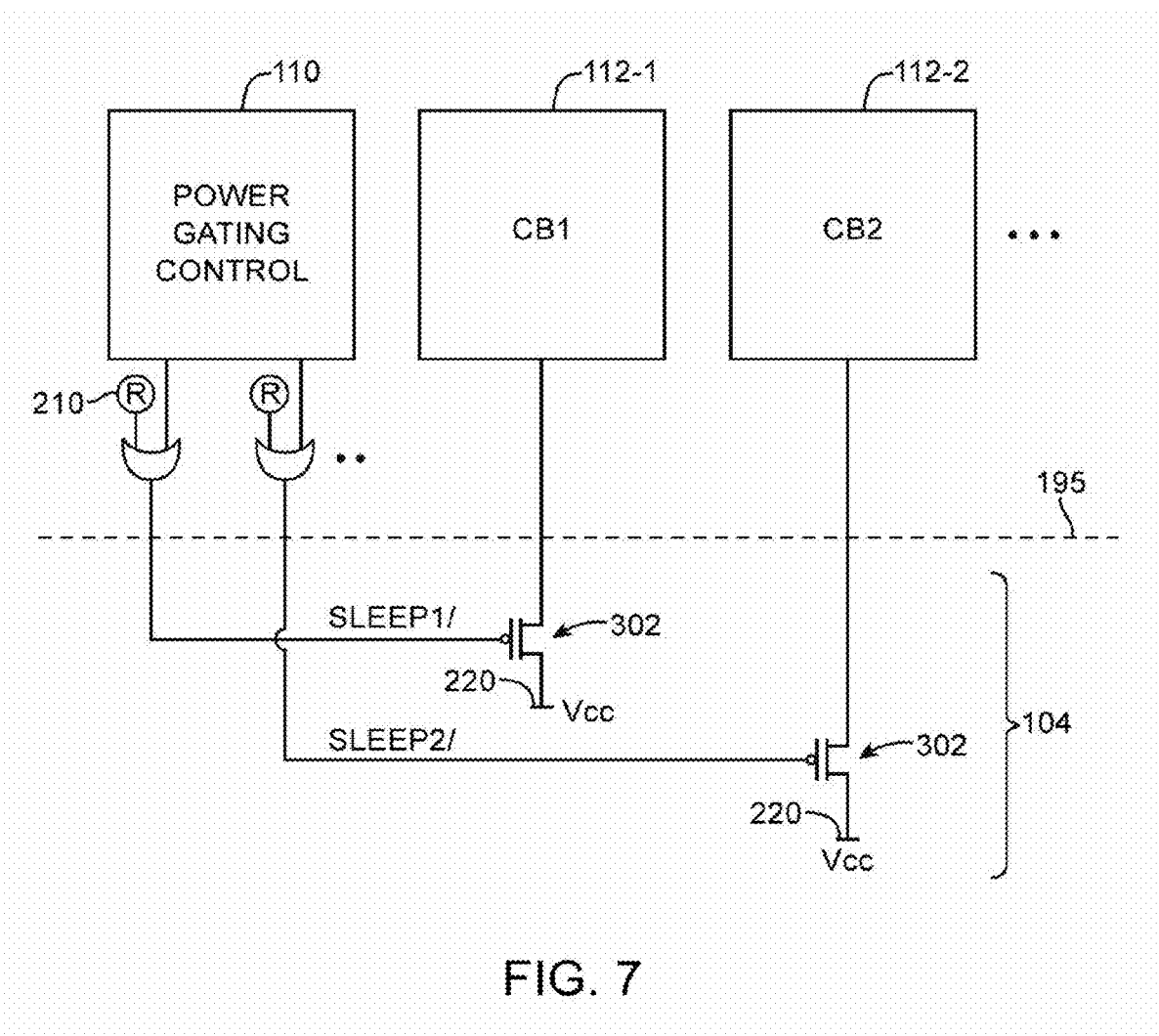
FIG. 7 is a diagram of power gating circuitry for supporting "coarse" power gating granularity in accordance with an embodiment of the present invention.

FIG. 7 is a diagram illustrating coarse power gating granularity in which each circuit block on device 10 is being power gated by a corresponding p-channel power gating transistor 302. In the example of FIG. 7, a first circuit block 112-1 is coupled to a first p-channel power gating transistor 302, whereas a second circuit block 112-2 is coupled to a second p-channel power gating transistor 302. The first and second power gating transistors may receive sleep control signals SLEEP1/ and SLEEP2/ from power gating control logic 110 (assuming memory elements 210 are storing a logic "0"). As described above, the coarse power gating granularity may be implemented via routing/shorting of the power lines to dedicated power gating transistors using interposer routing circuitry 104, via appropriate control of the sleep control signals using power gating control logic 110, or via a combination of these techniques. If desired, some of the circuit blocks 112 on device 10 can have fine power gating granularity, whereas other circuit blocks 112 can have coarse or intermediate power gating granularity.

Figure 8:
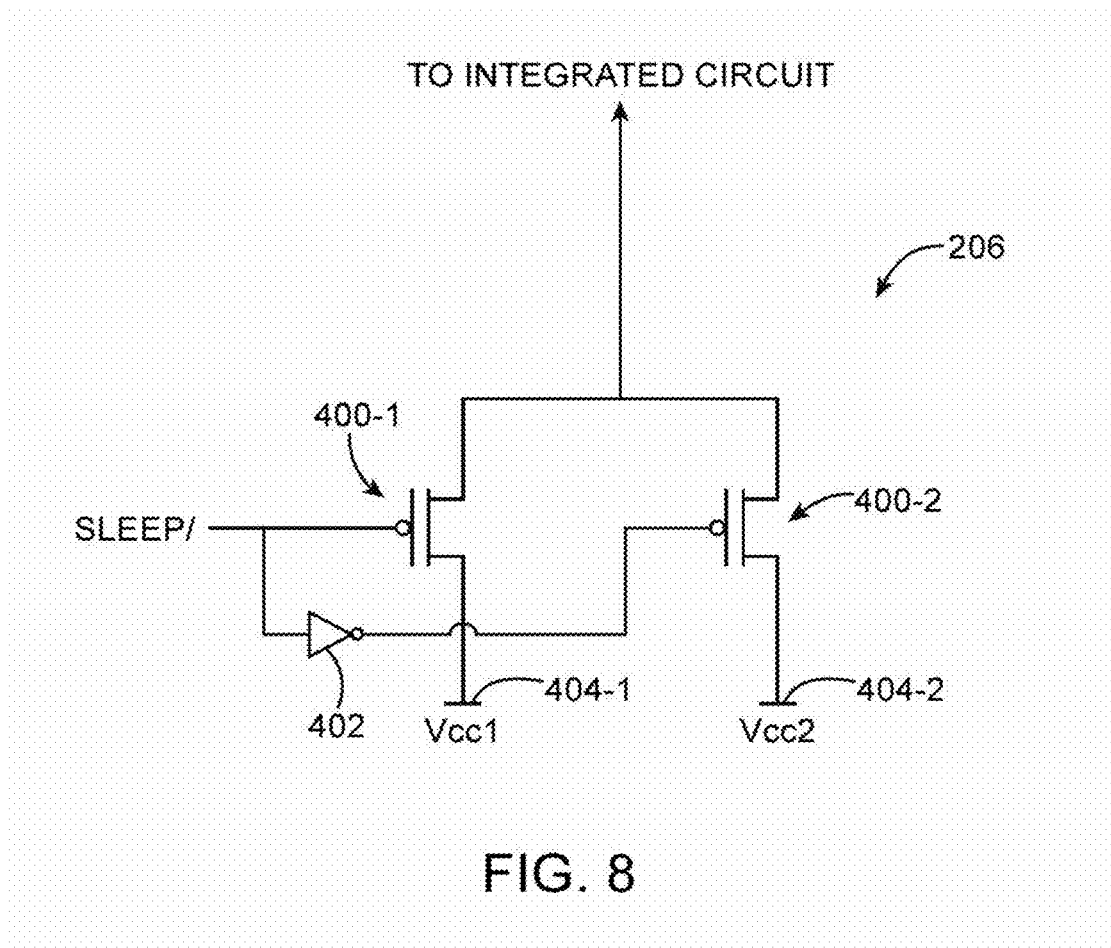
FIG. 8 is a circuit diagram showing power gating transistors that can be formed on an interposer and that are operable to generate multiple power supply voltage levels in accordance with an embodiment of the present invention.

In certain embodiments, more than one power gating transistor can be used for each gated block. FIG. 8 is a diagram showing how multiple power gating transistors may be used to enable the use of multiple power supply voltage islands. As shown in FIG. 8, power gating switch 206 may include a first p-channel transistor 400-1 coupled to a first power supply rail 404-1 on which a first positive power supply voltage Vcc1 is provided and may also include a second p-channel transistor 400-2 coupled to a second power supply rail 404-2 on which a second positive power supply voltage Vcc2 is provided. Transistor 400-1 may receive sleep control signal SLEEP/, whereas transistor 400-2 may receive an inverted version of SLEEP/ via inverting circuit 402. Arranged in this way, only one of power gating transistors 400-1 and 400-2 can be turned on at any given point in time to supply the corresponding circuit block on device 10 with a selected one of Vcc1 or Vcc2. In the example of FIG. 8, signal SLEEP/ may be driven low to activate transistor 400-1 so that Vcc1 is provided to device 10 while transistor 400-2 is turned off. Signal SLEEP/ may be driven high to turn on transistor 400-2 so that Vcc2 is provided to device 10 while transistor 400-1 is switched out of use.

Power gating circuit 206 of the type shown in FIG. 8 can be used to support use of two different power supply voltages and can be used to power gate an individual logic sub-block or multiplexer (e.g., when supporting fine power gating granularity), to power gate a group of logic sub-blocks or a group of routing circuits (e.g., when supporting intermediate power gating granularity), or to power gate an entire circuit block or logic region (e.g., when supporting coarse power gating granularity). Circuitry that is powered using Vcc1 may sometimes be referred to as belonging to a first voltage island, whereas circuitry that is powered using Vcc2 may be referred to as belonging to a second voltage island. This is merely illustrative. Power gating circuit 206 may include any suitable number of transistors coupled in parallel to support implementation of any desired number of voltage islands.

Figure 9:
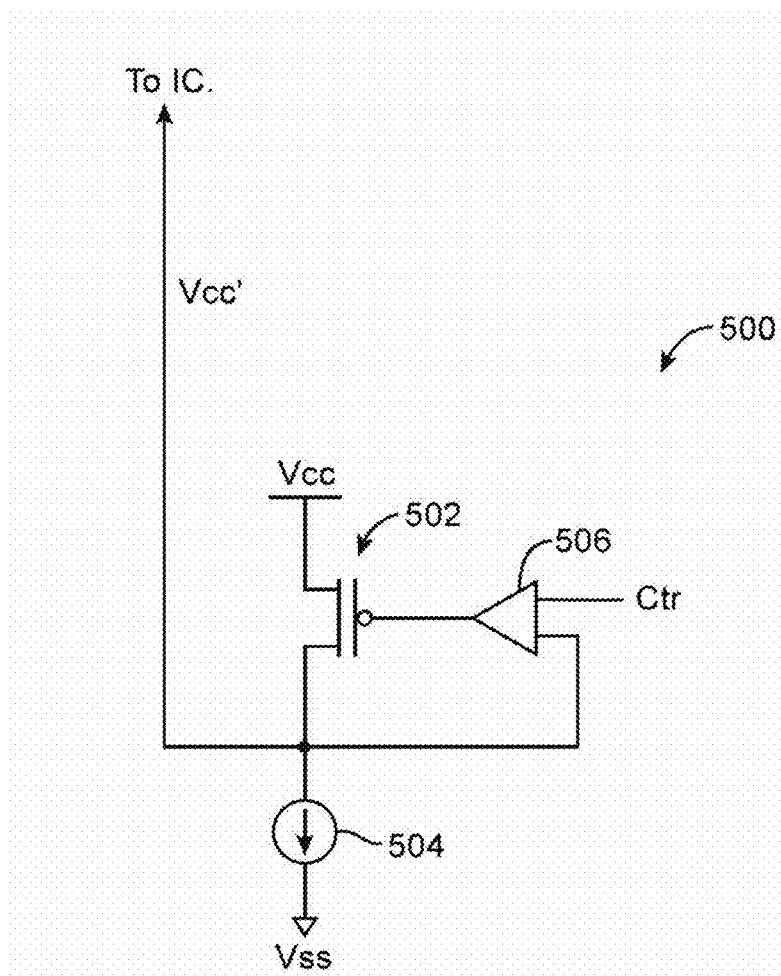
FIG. 9 is a circuit diagram showing an adjustable voltage regulator that can be formed on an interposer and that is operable to generate an adjustable power supply voltage in accordance with an embodiment of the present invention.

In yet another suitable embodiment, each power gating circuit may be implemented using on-chip power regulators such as voltage regulator circuit 500 (see, e.g., FIG. 9). As shown in FIG. 9, voltage regulator 500 may include a p-channel pull-up transistor 502, an amplifier 506, and a current source 504. Pull-up transistor 502 may have a source terminal coupled to a power rail on which positive power supply voltage Vcc is provided, a drain terminal that is coupled to current source 504, and a gate. Current source 504 may be implemented using a current mirror configuration or other suitable current supplying circuit. Amplifier circuit 506 may have an output that is coupled to the gate of transistor 502, a first input terminal that is coupled to the drain terminal of transistor 502, and a second input terminal that receives a control voltage signal Ctr. Signal Ctr may be provided from device 10 using power gating control logic 110. Depending on the value of Ctr, a corresponding power supply voltage Vcc' may be provided to circuitry that is associated with that particular power gating circuitry 500.

For example, Ctr may be set to a first voltage level for deactivating regulator 500 (i.e., so that Vcc' is a low voltage signal). Signal Ctr may also be set to a second voltage level for configuring regulator 500 to output Vcc' that is substantially equal to the nominal power supply voltage of device 10. Signal Ctr may yet be set to other voltage levels for configuring regulator 500 to output Vcc' that is at some intermediate voltage level between zero volts and the nominal power supply voltage of device 10. Power gating control logic 110 may adjust signal Ctr in real time to perform dynamic voltage scaling while implementing desired power gating granularity.

Figure 10:
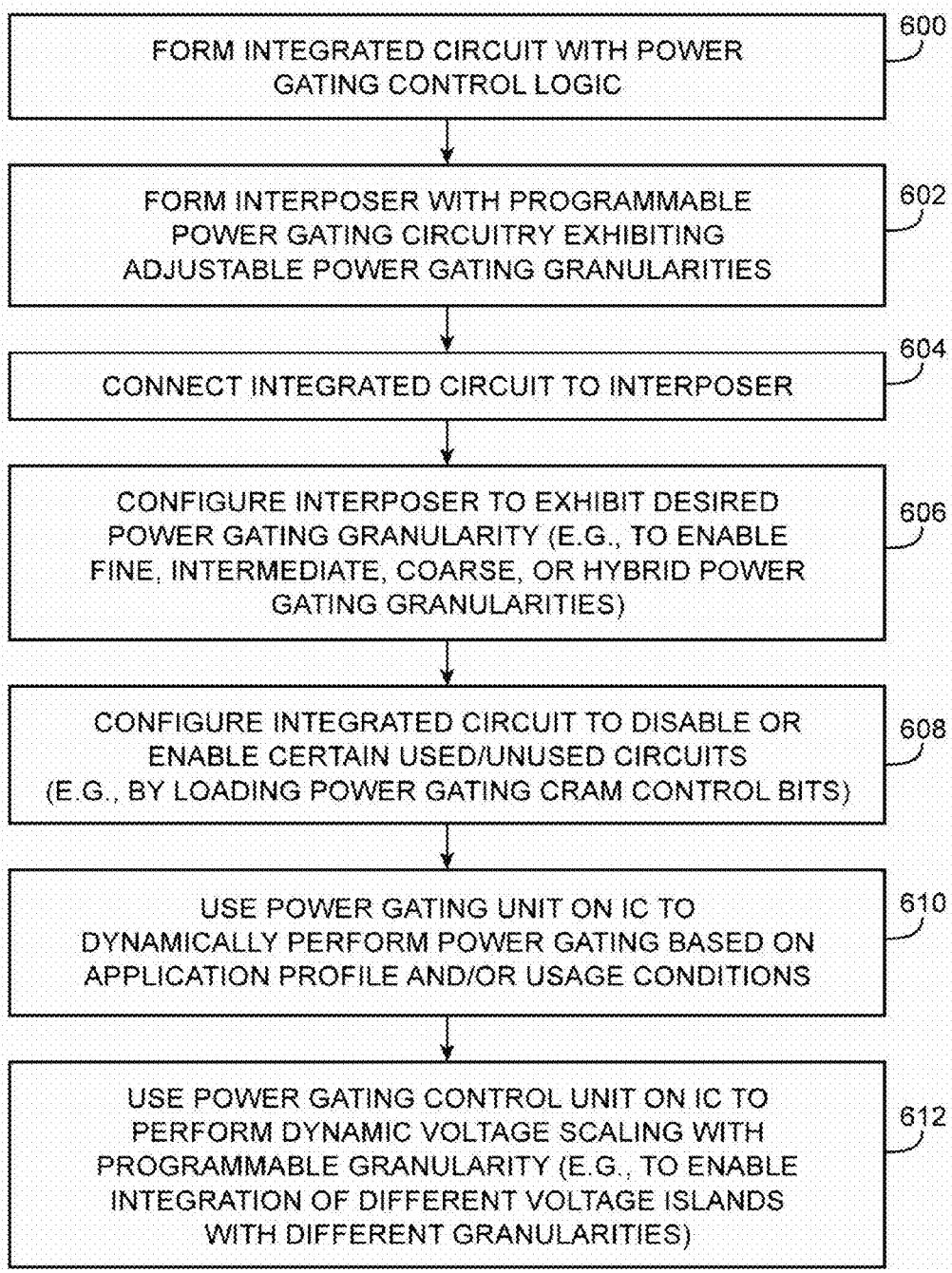
FIG. 10 is a flow chart of illustrative steps for configuring a multichip package to exhibit a desired power gating granularity arrangement in accordance with an embodiment of the present invention.

FIG. 10 is a flow chart of illustrative steps involved in forming and operating a multichip package having an interposer with programmable power gating capabilities. At step 600, an integrated circuit may be formed that includes power gating control logic 110. Power gating control logic 110 may be provided with fuse/programming information to implement the desired power gating granularity.

At step 602, an interposer with programmable power gating circuitry 104 may be formed. The programmable power gating circuitry 104 may be used to provide fine power gating granularity, intermediate power gating granularity, coarse power gating granularity, or a combination of these for any suitable portion of circuitry on the integrated circuit.

At step 604, the integrated circuit may be connected to the interposer (e.g., the integrated circuit may be mounted on the interposer). Circuitry on the integrated circuit may be coupled to programmable power gating circuitry 104 on the interposer via microbumps formed at the interface between the integrated circuit and the interposer and via routing with interposer routing circuitry 106.

At step 606, the interposer may be configured to exhibit the desired power gating granularity. For example, each power rail from the on-interposer integrated circuit may be routed to a dedicated power gating transistor to support fine power gating granularity. As another example, at least some power rails from the on-interposer integrated circuit may be shorted to one another and may be coupled to a common power gating transistor to support intermediate power gating granularity. As yet another example, a large number of power rails each of which is associated with an entire logic region on the on-interposer integrated circuit may be shorted to one another and may be coupled to a single shared power gating transistor to support coarse power gating granularity. In other embodiments, shorting of power rails and routing to one shared power gating transistor need not be done if each of the individual dedicated power gating transistors can be jointly controlled using power gating control logic 110.

At step 608, power gating control logic 110 on the integrated circuit may be configured to enable/disable certain used/unused portion of circuitry on the integrated circuit. For example, at least some of memory elements 210 may be set to statically disable the corresponding power gating transistors (as described in connection with FIG. 5). The state of the other non-permanently disabled power gating transistors may be controlled directly by signals output from power gating control logic 110.

At step 610, power gating control unit 110 on the integrated circuit may dynamically control the power gating granularity setting based on the current application profile and/or usage conditions. For example, power gating control unit 110 may be configured to support coarse power gating granularity during applications that require higher performance without any power constraints. On the other hand, power gating control unit 110 may be configured to support fine power gating granularity during applications that require minimal power consumption.

At step 612, power gating control logic 110 may optionally be used to enable multiple voltage islands and/or perform dynamic voltage scaling. For example, power gating control logic 110 may rely on the usage of multiple parallel-connected pull-up transistors (as shown in FIG. 8) to provide different portions of the integrated circuit with different power supply voltage levels. As another example, power gating control logic 110 may rely on the usage of internal voltage regulars (as shown in FIG. 9) to selectively adjust the voltage for a particular group of circuits to perform desired performance/power tradeoffs.

The programmable logic device described in one or more embodiments herein may be part of a data processing system that includes one or more of the following components: a processor; memory; IO circuitry; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system. In one embodiment, the programmable logic device may be one of the family of devices owned by ALTERA Corporation.

Although the methods of operations were described in a specific order, it should be understood that other operations may be performed in between described operations, described operations may be adjusted so that they occur at slightly different times or described operations may be distributed in a system which allows occurrence of the processing operations at various intervals associated with the processing, as long as the processing of the overlay operations are performed in a desired way.

The foregoing is merely illustrative of the principles of this invention and various modifications can be made by those skilled in the art without departing from the scope and spirit of the invention. The foregoing embodiments may be implemented individually or in any combination.

What is claimed is:

1. An integrated circuit package, comprising:
   an interposer; and
   at least one integrated circuit mounted on the interposer, wherein the interposer includes power gating circuitry operable at first and second power gating granularity settings; and
   first and second circuits, wherein the first and second circuits are coupled to a shared power gating transistor in the power gating circuitry when the power gating circuitry is operated at the first power gating granularity setting, and wherein the first and second circuits are coupled to different power gating transistors in the power gating circuitry when the power gating circuitry is operated at the second power gating granularity setting.

2. The integrated circuit package defined in claim 1, further comprising:
   a control circuit for providing power gating control signals to the power gating circuitry on the interposer, wherein the control circuit is formed on a device selected from one of the integrated circuit and the interposer.

3. The integrated circuit package defined in claim 2, wherein the interposer further includes:
   configurable routing circuitry that routes the control signals generated from the control circuit to the power gating circuitry.

4. The integrated circuit package defined in claim 2, further comprising:
   a plurality of memory elements; and
   a plurality of logic gates each of which has a first input that receives a respective one of the control signals from the control circuit, a second input that receives a static control bit from a respective one of the plurality of memory elements, and an output that is coupled to a corresponding power gating transistor in the power gating circuitry, wherein the plurality of memory elements and the plurality of logic gates are formed on the selected device.

5. An integrated circuit package, comprising:
   an interposer that includes programmable power gating circuitry configurable in first and second power gating modes, wherein the programmable power gating circuitry includes at least first and second power gating switches; and
   at least one integrated circuit mounted on the interposer, wherein:
   the integrated circuit includes a first circuit that is coupled to the first power gating switch,
   the integrated circuit includes a second circuit that is coupled to the second power gating switch,
   the first and second power gating switches receive identical control signals when the programmable power gating circuitry is configured in the first power gating mode,
   the first and second power gating switches receive different control signals when the programmable power gating circuitry is configured in the second power gating mode,
   the first and second power gating switches each have a gate terminal,
   the gate terminal of the first power gating switch is coupled to the gate terminal of the second power gating switch when the programmable power gating circuitry is configured in the first power gating mode, and
   the gate terminal of the first power gating switch is decoupled from the gate terminal of the second power gating switch when the programmable power gating circuitry is configured in the second power gating mode.

6. The integrated circuit package defined in claim 5, wherein the first and second power gating switches comprise pull-up transistors.

7. The integrated circuit package defined in claim 5, wherein the first power gating switch comprises first and second p-channel transistors coupled in parallel, wherein the first p-channel transistor is connected to a first power supply line on which a first power supply voltage is provided, and wherein the second p-channel transistor is connected to a second power supply line on which a second power supply voltage that is different than the first power supply voltage is provided.

8. The integrated circuit package defined in claim 5, wherein the first power gating switch comprises a voltage regulator.

9. The integrated circuit package defined in claim 5, further comprising:
   a power management unit that generates the control signals for the programmable power gating circuit, wherein the power management unit is formed on a selected one of the integrated circuit and the interposer.

10. The integrated circuit package defined in claim 5, wherein the first circuit comprises a multiplexing circuit.

11. The integrated circuit package defined in claim 5, further comprising:
    an additional integrated circuit mounted on the interposer.

12. A method for operating an integrated circuit that is coupled to an interposer in an integrated circuit package, wherein the interposer includes a plurality of power gating switches for power gating at least first and second circuits on the integrated circuit, the method comprising:
    with power control circuitry in the integrated circuit package, configuring the plurality of power gating switches to provide a fine power gating granularity in which a first maximum number of circuits on the integrated circuit can be individually power gated; and
    with the power control circuitry, configuring the plurality of power gating switches to provide a coarse power gating granularity in which a second maximum number of circuits on the integrated circuit can be individually power gated, wherein the first maximum number is greater than the second maximum number.

13. The method defined in claim 12, further comprising:
    while the plurality of power gating switches are configured to provide the fine power gating granularity, providing power to the first circuit and preventing power from being supplied to the second circuit.

14. The method defined in claim 12, wherein the plurality of power gating switches comprises voltage regulators, the method further comprising:

performing dynamic voltage scaling by outputting adjustable power supply voltage levels to the first and second circuits with the voltage regulators.

15. The method defined in claim 12, further comprising:
with a first power gating switch in the plurality of power gating switches, supplying a first positive power supply voltage to the first circuit; and
with a second power gating switch in the plurality of power gating switches, supplying a second positive power supply voltage that is different than the first positive power supply voltage to the second circuit.

16. The method defined in claim 12, further comprising:
configuring a first group of memory elements to statically disable a first group of corresponding power gating switches in the plurality of power gating switches; and
configuring a second group of memory elements to enable the power control circuitry to dynamically control a second group of corresponding power gating switches in the plurality of power gating switches.

17. The method defined in claim 12, wherein the power control circuitry comprises power gating control logic formed on a selected one of the integrated circuit and the interposer.

\* \* \* \* \*